United States Patent
Lu et al.

(10) Patent No.: US 7,494,928 B2
(45) Date of Patent: Feb. 24, 2009

(54) METHOD FOR PATTERNING AND ETCHING A PASSIVATION LAYER

(75) Inventors: Shin-Rung Lu, Chu-Bei (TW); Kun-Hong Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 450 days.

(21) Appl. No.: 11/230,347

(22) Filed: Sep. 20, 2005

(65) Prior Publication Data
US 2007/0066049 A1 Mar. 22, 2007

(51) Int. Cl.
*H01L 21/302* (2006.01)
*H01L 21/461* (2006.01)

(52) U.S. Cl. .................. 438/689; 438/612; 438/687

(58) Field of Classification Search ................ 438/612, 438/687, 689, 780, 781, 782
See application file for complete search history.

(56) References Cited

U.S. PATENT DOCUMENTS

| | | | | | |
|---|---|---|---|---|---|
| 5,229,257 | A | * | 7/1993 | Cronin et al. | 430/315 |
| 6,635,585 | B1 | * | 10/2003 | Khe et al. | 438/780 |
| 6,660,624 | B2 | * | 12/2003 | Tzeng et al. | 438/612 |

* cited by examiner

*Primary Examiner*—Phuc T Dang
(74) *Attorney, Agent, or Firm*—Tung & Associates

(57) ABSTRACT

A method for patterning passivation layers including providing a semiconductor wafer comprising metal interconnects; forming a dielectric passivation layer on the metal interconnects; forming a photosensitive polymeric passivation layer on the dielectric passivation layer; patterning the photosensitive polymeric passivation layer in a first patterning process to form a first opening revealing a portion of the dielectric passivation layer; and, patterning the portion of the dielectric passivation layer in a second patterning process to form at least a second opening in the dielectric passivation layer.

20 Claims, 2 Drawing Sheets

METHOD FOR PATTERNING AND ETCHING A PASSIVATION LAYER

FIELD OF THE INVENTION

This invention generally relates to integrated circuit manufacturing methods and more particularly to a method of patterning and etching passivation layers over metal interconnect features including bonding pads to improve patterning dimensional accuracy including reducing contaminating residue and improving a process flow throughput.

BACKGROUND OF THE INVENTION

In typical multilayer semiconductor integrated circuits including several layers of interconnect wiring, the uppermost layers typically include metal bonding pads for forming electrical connection with the semiconductor device (chip) surface to a package which contains the chip. The bonding pads are typically formed in an array on the chip surface which in turn forms an array on a process wafer surface.

Prior to cutting the process wafer into the various constituent chips, the semiconductor wafer surface including the bonding pads are covered with one or more passivation layers to provide electrical insulation between the conducting areas and to physically protect the chip surface to prevent absorption of moisture or other contaminants.

The passivation layers must first be patterned and etched to form openings over the bonding pads in order to make the bonding pads accessible to subsequent bonding operations.

Recently, it has been the practice to use a polyimide as an uppermost passivation layer on the process wafer surface after patterning and etching an opening through an underlying passivation layer over the bonding pads. A polyimide resin is excellent in electrical and mechanical characteristics, including high heat resistance and is advantageously used as a surface-protecting and insulation layer for a semiconductor device.

One problem with prior art processes using polyimide has been the tendency of the polyimide to shrink in volume up to about 50 percent following a curing process to remove solvent, making a one mask patterning process unreliable to achieve the same pattern in the polyimide and the underlying passivation layer.

Various approaches in the prior art have been proposed for the process flow of patterning and etching to overcome the problems of polyimide shrinking. However, another problem that has presented itself is the tendency for the polyimide to leave a polyimide residue on the underlying passivation layer following a curing process, thereby degrading subsequent bonding operations, reducing a chip yield. For example, subsequently formed bonds to the bonding pad surface exhibit a high rate of failure due to poor adhesion.

There is therefore is a need in the integrated circuit manufacturing process art to develop a passivation layer patterning and etching process to improve a patterning process and reduce bonding pad contamination to improve chip yield and performance while improving a process flow.

It is therefore an object of the invention to provide an improved passivation layer patterning and etching process to improve a patterning process and reduce bonding pad contamination to improve chip yield and performance while improving a process flow, in addition to overcoming other shortcomings of the prior art.

SUMMARY OF THE INVENTION

To achieve the foregoing and other objects, and in accordance with the purposes of the present invention, as embodied and broadly described herein, the present invention provides a method for patterning passivation layers.

In a first embodiment, the method includes providing a semiconductor wafer comprising metal interconnects; forming a dielectric passivation layer on the metal interconnects; forming a photosensitive polymeric passivation layer on the dielectric passivation layer; patterning the photosensitive polymeric passivation layer in a first patterning process to form a first opening revealing a portion of the dielectric passivation layer; and, patterning the portion of the dielectric passivation layer in a second patterning process to form at least a second opening in the dielectric passivation layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with specific reference to the use of an uppermost polyimide passivation layer, it will be appreciated that the method of the present invention may be used with any uppermost polymeric passivation layer to avoid leaving a polymeric residue on an underlying patterned passivation layer in a two mask patterning and etching process.

Figure 1A:
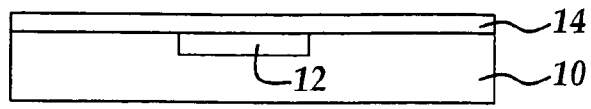
FIGS. 1A-1D are cross sectional views of a portion of a semiconductor process wafer at stages in a manufacture according to an embodiment of the present invention.

In an exemplary embodiment applying the method of the present invention in conjunction with a semiconductor chip formation process shown in FIGS. 1A-1D, referring first to FIG. 1A, is shown a cross section of a portion of a semiconductor process wafer at a stage in a manufacturing process including one or multiple dielectric passivation layers e.g., 14 overlying a substrate 10, for example a dielectric insulating layer including a conductive area 12, for example one or more metal bonding pads.

The dielectric passivation layer 14 may be formed of CVD or spin-on silicon oxide (e.g., $SiO_2$), CVD silicon nitride (e.g., $Si_3N_4$), CVD silicon oxynitride (e.g., SiON), or combinations thereof. The dielectric passivation layer 14 is typically 1000 Angstroms to about 20000 Angstroms thick. CVD methods may include LPCVD, PECVD, or APCVD methods.

Figure 1B:
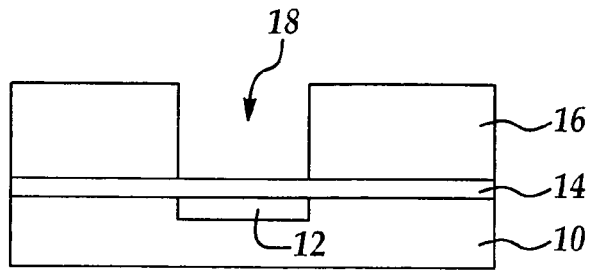

Referring to FIG. 1B, a second polymeric passivation layer 16, preferably a polyimide resin is deposited over the dielectric passivation layer 14, for example by a conventional spin-coating process. The polyimide resin may have a viscosity of about 3000 to about 4000 centipoise (cp), preferably greater than about 3000 cp, to provide greater stability in patterning smaller bonding pad openings in the dielectric passivation layer as explained below, for example having a length on a rectangular side less than about 10 microns, for example about 5 microns or less.

Still referring to FIG. 1B, a first photolithographic patterning process, e.g., photo-exposure and development is applied to the polyimide passivation layer 16 to form an opening 18 exposing a portion of the dielectric passivation layer 14 overlying conductive area 12. For example the opening 18 has a width of about 50 microns to about 150 microns. It will be appreciated that various photosensitive additives may be included in the polyimide resin having a sensitivity at conventional photolithographic patterning wavelengths, for example less than about 400 nm. It will be appreciated that the polyimide passivation layer 16 may act positively or negatively with respect to an exposure and development process.

Figure 1C:
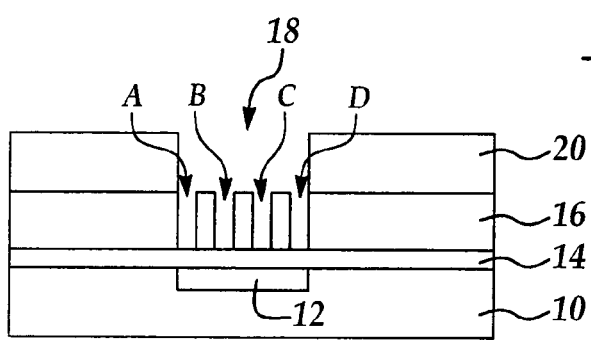

Referring to FIG. 1C, following photolithographic patterning, the patterned polyimide layer 16 is preferably subjected to a photo and/or a thermal curing process. For example, to add etching resistance to the polyimide, following patterning of the polyimide layer, preferably a photo-curing process is first carried out by exposing the patterned polyimide layer 16 to radiant energy (e.g., UV light) wavelengths of less than about 400 nm for a period of about 15 seconds to about 90 second followed by a thermal curing step at a temperature between about 200° C. and about 450° C. for a period of time between about 10 minutes and about 6 hours. It will be appreciated that the polyimide layer 16 experiences volume shrinkage during the curing process.

In an important aspect of the invention, since the underlying dielectric passivation layer 14 is not yet etched to form openings prior to patterning the polyimide passivation layer, the problem of residue accumulation, for example following development, in underlying dielectric passivation layer openings is avoided. In addition, the polyimide passivation layer 16 is thinner e.g., less than about 10 microns following curing thereby improving formation and patterning of an overlying photoresist layer as explained below.

Still referring to FIG. 1C, a photoresist layer 20 is then formed over the polyimide layer 16 and patterned by a second photolithographic patterning process to form one or more, preferably more than one, opening e.g., A, B, C, D, in the photoresist layer 20 at the bottom of the opening 18 overlying the dielectric passivation layer 14 and overlying conductive area 12.

Figure 1D:
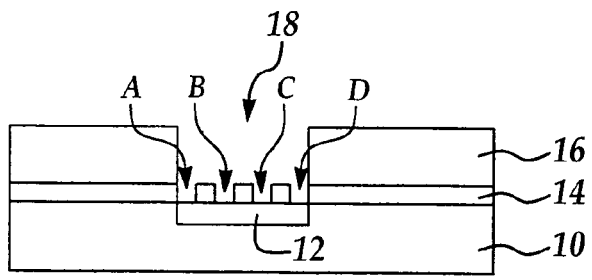

Referring to FIG. 1D, a conventional RIE process, for example including a fluorocarbon etching chemistry is then carried out to etch openings in the dielectric passivation layer 14 corresponding to the patterned photoresist layer 20 openings e.g., A, B, C, D, to expose a surface of the underlying conductive area. Following etching, the photoresist layer 20 is removed by an ashing and/or wet stripping process, preferably a wet stripping process. Advantageously, the cured polyimide layer has an improved resistance to the resist stripping process.

Thus, according to the first embodiment of the present invention, also referred to as a two mask process, the two mask process has the advantage of avoiding polyimide residue accumulation in previously patterned dielectric passivation layer 14 openings. As a result, a reduced polyimide development time is required thereby increasing throughput since it is no longer necessary to remove accumulated polyimide residue. In addition, curing the polyimide layer 16 prior to patterning the dielectric passivation layer 14 provides increased etching resistance which protects the polyimide passivation layer and improves the dielectric passivation layer patterning. The curing process also advantageously reduces the thickness of the polyimide layer allowing improved photoresist layer formation and patterning.

Figure 2A:
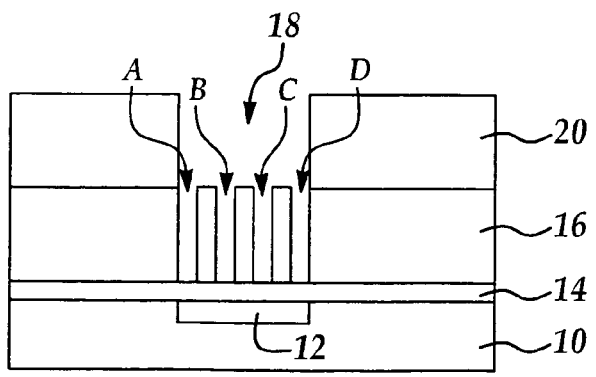
FIGS. 2A-2C are cross sectional views of a portion of a semiconductor process wafer at stages in a manufacture according to an embodiment of the present invention.
Figure 2B:
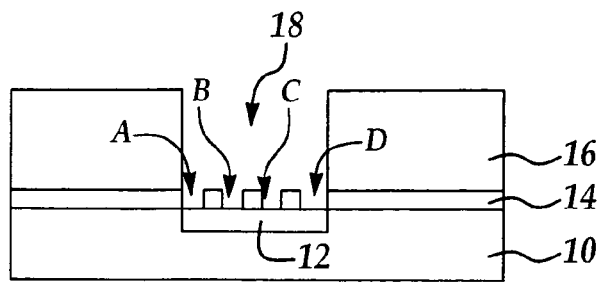
Figure 2C:
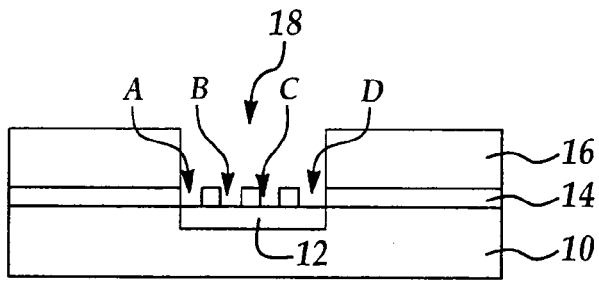

Referring to FIGS. 2A to 2C is shown a second embodiment including a process flow. Referring to FIG. 2A, in this embodiment, the polyimide layer 16 is not cured prior to the second photolithographic patterning process to form patterned openings e.g., A,B,C,D, and therefore is thicker requiring a thicker photoresist layer 20 to pattern the openings.

Referring to FIG. 2B, a similar dry etching process as previously explained is carried out to extend the openings e.g., A,B,C,D through the dielectric passivation layer 14 thickness, followed by stripping the resist layer 20.

Referring to FIG. 2C, a curing process, preferably thermal, is then carried out to cure the polyimide layer 16 at the preferred temperatures and times as previously explained for the first embodiment.

While the first embodiment is preferred due to the advantages gained by curing the polyimide layer 16 prior to patterning the dielectric passivation layer 14, it will be appreciated that by careful selection of a polyimide precursor viscosity, preferably greater than about 3000 cp and controlling the selectivity of the etching and resist stripping process, acceptable results may be obtained by carrying out the curing step following dielectric passivation layer patterning.

Figure 3:
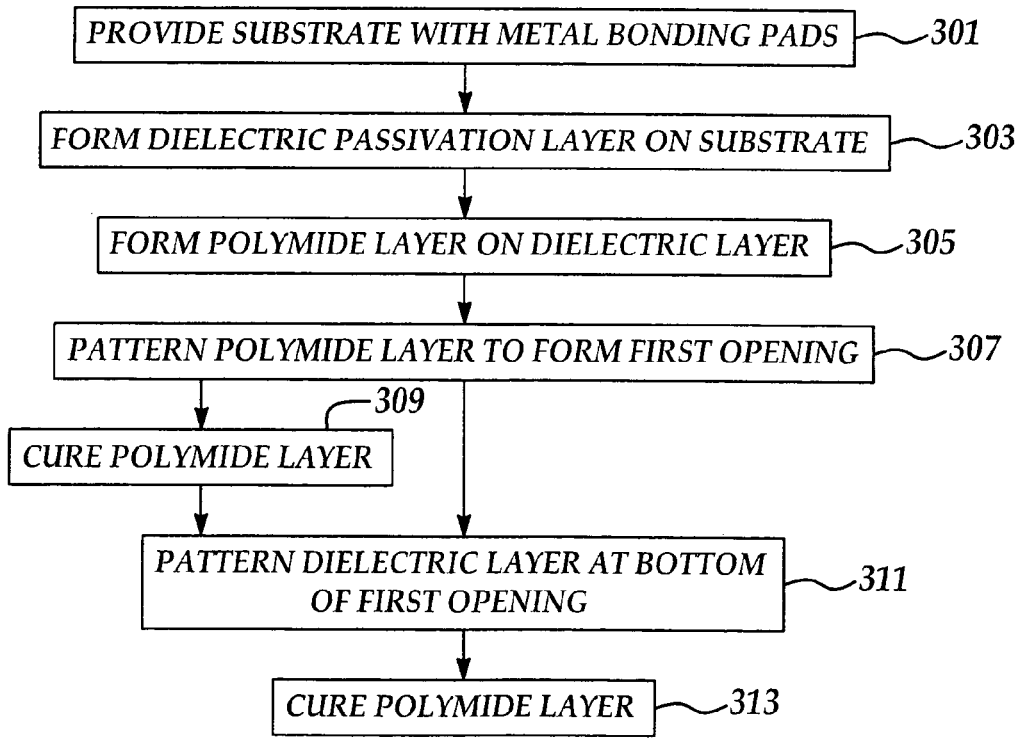
FIG. 3 is a process flow diagram including several embodiments of the present invention.

Referring to FIG. 3 is a process flow diagram including several embodiments of the present invention. In process 301, a substrate including metal bonding pads is provided. In process 303, at least one first dielectric passivation layer is formed over the substrate. In process 305, a photosensitive polymer passivation layer, preferably a polyimide is formed over the dielectric passivation layer. In process 307, the photosensitive polymer passivation layer is patterned to form a first opening. In process 309, an optional curing process is carried out. In process 311, one or more openings are patterned and formed at the bottom of the first opening. In process 313, an optional curing process is carried out.

Thus, according to the present invention, a process has been presented whereby a two step photolithographic patterning process (two mask process) is carried out to first form a first opening in a polyimide layer followed by forming second openings in a dielectric passivation layer at the bottom of the first opening, thereby avoiding the problem of polyimide residue accumulation in the second openings by a polyimide development and/or curing process. Advantageously, the method of the present invention also allows a reduced polyimide development time in the first photolithographic process since residue accumulation within underlying second openings is not a factor.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for patterning passivation layers comprising the steps of:
    providing a semiconductor wafer comprising metal interconnects;
    forming a dielectric passivation layer on the metal interconnects;
    forming a photosensitive polymeric passivation layer on the dielectric passivation layer;
    patterning the photosensitive polymeric passivation layer in a first patterning process to form a first opening revealing a first portion of the dielectric passivation layer; and, forming a photoresist layer over the photosensitive polymeric passivation layer and over the first portion of the dielectric passivation layer;

patterning the photoresist layer in a second photolithographic patterning process to form at least a second opening revealing second portions of the dielectric passivation layer.

2. The method of claim 1, further comprising the step of curing the photosensitive polymeric passivation layer prior to the second patterning process.

3. The method of claim 2 wherein the step of curing comprises a photo-curing process followed by a thermal curing process.

4. The method of claim 1, wherein the photosensitive polymeric passivation layer comprises a polyimide.

5. The method of claim 4, wherein the photosensitive polymeric passivation layer is formed from a polyimide containing precursor having a viscosity of greater than about 3000 centipoise.

6. The method of claim 1, further comprising the step of curing the photosensitive polymeric passivation layer following the second patterning process.

7. The method of claim 1, wherein the dielectric passivation layer is selected from the group consisting of silicon oxide, silicon nitride, and silicon oxynitride.

8. The method of claim 1, wherein the at least a second opening comprises a plurality of openings.

9. The method of claim 8, wherein the plurality of openings have a rectangular shape having a length on a side of less than about 10 microns.

10. The method of claim 1, wherein the metal interconnects comprise metal bonding pads.

11. The method of claim 1, where the second patterning process reveals the metal interconnect surfaces.

12. A method for patterning passivation layers to prevent polyimide residue accumulation in a patterned passivation layer comprising the steps of:

providing a semiconductor wafer comprising metal bonding pads;

forming a dielectric passivation layer on the metal bonding pads;

forming a photosensitive polyimide passivation layer on the dielectric passivation layer;

patterning the photosensitive polyimide passivation layer in a first photolithographic patterning process to form a first opening revealing a first portion of the dielectric passivation layer;

forming a photoresist layer over the polyimide passivation layer and over the first portion of the dielectric passivation layer;

patterning the photoresist layer in a second photolithographic patterning process to form at least a second opening revealing second portions of the dielectric passivation layer; and, carrying out a dry etching process to transfer the at least a second opening through the dielectric passivation layer thickness.

13. The method of claim 12, further comprising the step of curing the photosensitive polyimide passivation layer prior to the second photolithographic patterning process.

14. The method of claim 13 wherein the step of curing comprises a photo-curing process followed by a thermal curing process.

15. The method of claim 12, wherein the polyimide passivation layer is formed from a precursor having a viscosity of greater than about 3000 centipoise.

16. The method of claim 12, further comprising the step of curing the photosensitive polyimide passivation layer following the second photolithographic patterning process.

17. The method of claim 12, wherein the dielectric passivation layer is selected from the group consisting of silicon oxide, silicon nitride, and silicon oxynitride.

18. The method of claim 12, wherein the plurality of openings comprise a rectangular shape having a length on a side of less than about 10 microns.

19. The method of claim 12, where the second patterning process reveals the metal bonding pad surfaces.

20. The method of claim 12, wherein the metal bonding pads comprise a metal selected from the group consisting of aluminum, copper, and alloys thereof.

* * * * *